Feb. 6, 1968 H. J. FUMEA, JR., ET AL 3,368,157

CIRCUITRY FOR STATIC BANDWIDTH CONTROL OVER
A WIDE DYNAMIC RANGE
Filed May 20, 1965

INVENTORS
Harry J. Fumea and
Robert L. Parks
BY
Ernest P. Klipfel
ATTORNEY

United States Patent Office 3,368,157

Patented Feb. 6, 1968

3,368,157

CIRCUITRY FOR STATIC BANDWIDTH CONTROL OVER A WIDE DYNAMIC RANGE

Harry J. Fumea, Jr., and Robert L. Parks, Baltimore, Md., assignors to Westinghouse Electric Corporation, Pittsburgh, Pa., a corporation of Pennsylvania Filed May 20, 1965, Ser. No. 457,452

3 Claims. (Cl. 330—24)

ABSTRACT OF THE DISCLOSURE

A bandwidth control circuit utilizing voltage controlled impedance elements such as field effect transistors in the output and common impedance of a semi-conductor translating device, such as the transistor. A control signal simultaneously controls the magnitude of the output impedance and the magnitude of the common impedance to vary the bandwidth and maintain constant center frequency gain as the bandwidth is varied, respectively.

The present invention relates generally to static bandwidth control and more particularly relates to static circuitry for controlling bandwidth over a wide dynamic range with a constant center frequency gain.

Static miniature circuitry for accurately controlling bandwidth over a wide dynamic range is highly desirable for communication and television receivers as well as radar receivers, especially where the pulse width changes with each pulse repetition frequency. The present invention eliminates the need for mechanical components such as variable capacitors and coils, which are normally used for bandwidth control. It also provides bandwidth control capability at a high speed, which is not possible with conventional techniques where complete replacement or mechanical tuning is used.

An object of the present invention is to provide static bandwidth control circuitry capable of miniaturization or even molecularization.

Another object of the present invention is to provide circuitry for controlling bandwidth with a fast rate of response.

Another object of the present invention is to provide circuitry which electronically varies the bandwidth of a variable frequency signal allowed therethrough over a wide dynamic range.

Another object of the present invention is to provide circuitry for allowing large variations in the bandwidth with a constant center frequency gain.

Another object of the present invention is to provide circuitry for fast and accurate voltage control of IF signal bandwidth.

Another object of the present invention is to provide in a static circuit, bandwidth and gain compensation elements which have tremendously large dynamic ranges, in the order of megohms.

Briefly, the present invention accomplishes the above-cited objects by providing a bandwidth control circuit, voltage controlled impedance elements, such as field effect transistors, in the output impedance and in the common impedance of a semiconductor translating device, such as a transistor. A control signal is provided to control the magnitude of the output impedance thereby varying the bandwidth. At the same time the voltage signal controls the magnitude of the common impedance to maintain a constant center frequency gain as the bandwidth of the circuit is varied.

Further objects and advantages of the present invention will be readily apparent from the following detailed description taken in conjunction with the drawing, in which.

Figure 1:
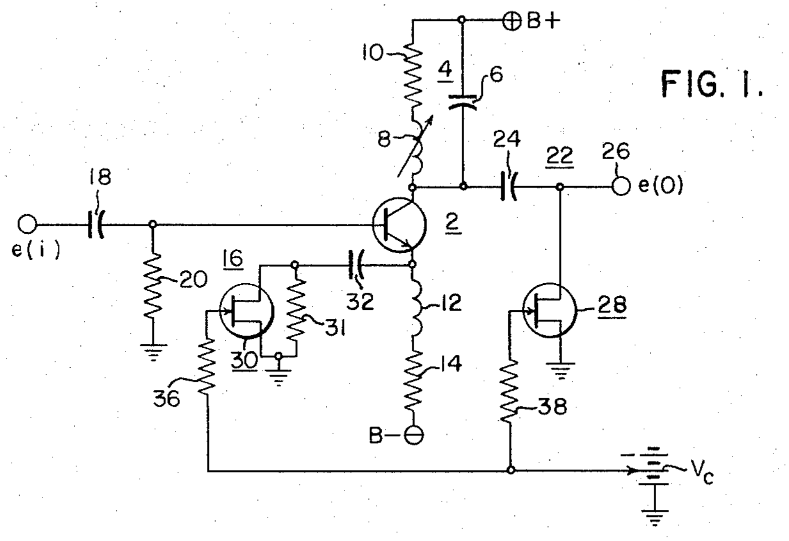
FIGURE 1 is an electrical schematic diagram of an illustrative embodiment of the present invention.

A static controlled bandwidth circuit in accordance with the present invention is shown in FIG. 1. A signal translating device such as a transistor 2 is connected as a common emitter stage and is tuned by a resonant circuit 4 such as the parallel combination of capacitor 6, inductor 8 and resistor 10, connecting the supply B+ to the collector electrode of the transistor 2. Inductor 12 and resistor 14 connect the supply B− to the emitter electrode. Two supplies B+ and B− are utilized for a more efficient circuit as far as direct current considerations are concerned. Resistor 14 is the biasing resistor which determines the amount of D.C. current that is drawn by the transistor 2.

An input circuit 16 including an input feed-through capacitor 18 and input resistor 20 connects the variable frequency input signal $e(i)$ to the base electrode of the transistor 2. An output circuit 22, including an output feed-through capacitor 24, provides an output signal $e(O)$ having a frequency and amplitude dependent upon the bandwidth and gain characteristics of the circuit.

A field effect transistor 28 connects the output terminal 26 to ground and is connected in parallel circuit combination with the series circuit of B+ supply and the impedance presented by the tuned circuit 4.

Another field effect transistor 30 connects the emitter electrode of the transistor 2 to ground through a bypass capacitor 32. An impedance element or resistor 31 is connected across the drain-source circuit of the field effect transistor 30 and is selected to have an impedance of magnitude substantially equal to the impedance of the tuned circuit 4 when at resonance. Isolation resistors 36 and 38 connect to the gate of the field effect transistors 30 and 28, respectively to a control voltage source $-V_c$ which varies in magnitude. Resistors 36 and 38 are isolation resistors, and the high input resistance of the field effect transistors 28 and 30 places a negligible load on the control voltage source $-V_c$.

Inductor 12 is used to make the total A.C. impedance of the series biasing branch, including resistor 14, large relative to the rest of the common impedance made up of the parallel combination of field effect transistor 30 and resistor 31. Otherwise a small A.C. impedance, resistor 14 alone, would short out transistor 30 and resistor 31. The inductor 12 offers a low D.C. resistance and therefore does not interfere with the D.C. biasing current set up by resistor 14.

The field effect transistors 28 and 30 are matched and used as voltage controlled resistors. These transistors are operated below the drain pinch-off voltage where the characteristics in the ohmic region are linear. The voltage gain of the FIG. 1 circuit is given as:

$$K_v = \frac{Z_c}{Z_e} \quad (1)$$

where $Z_c$ is the overall output or collector impedance and $Z_e$ is the total common or emitted impedance.

The total output impedance is the impedance presented by the field effect transistor 28, designated as $R'_3$ in parallel circuit combination with the impedance of the tuned circuit 4, designated as $Z_p$, so that $$Z_c = Z_p || R'_3 = \frac{R'_3 Z_p}{R'_3 + Z_p} \quad (2)$$

The total common impedance is given as:

$$Z_e=(R_p||R'_2)||(X_{L2}+R_e) \quad (3)$$

where $R'_2$ is the resistance of the field effect transistor 30 presented by its drain-source circuit and $X_{L2}$ is the reactance of the inductor 12.

If the impedance $(X_{L2}+R_e)$ is made large compared to the parallel impedance of $R_p$ and $R'_2$ at the frequencies in question, the total common impedance or emitter impedance can be simplified as:

$$Z_e=R_p||R'_2=\frac{R'_2R_p}{R'_2+R_p} \quad (4)$$

Substituting Equation 2 and Equation 4 into Equation 1, the voltage gain of the circuit can be shown:

$$K_v=\frac{Z_p||R'_3}{R_p||R_2'}=\frac{\frac{Z_pR_3'}{Z_p+R_3'}}{\frac{R_pR_2'}{R_p+R_2'}}=\left(\frac{Z_pR_3'}{Z_p+R_3'}\right)\left(\frac{R_p+R_2'}{R_pR_2'}\right) \quad (5)$$

$$K_v=\frac{Z_p}{R_p}\left(\frac{R_L+R_p}{R_L+Z_p}\right) \quad (6)$$

where $R_L=R_2'=R_3'$ since the field effect transistors 28 and 30 are matched.

By choosing the resistor 31 to be equal to $L/RC$, the impedance $Z_p$ of the tuned circuit 4 at resonance is:

$$Z_p=Z_{po}=\frac{L}{RC}=R_p \quad (7)$$

where $Z_{po}=Z_p$ at resonance.

Therefore, at resonance the voltage gain is given as:

$$K_{vo}=\frac{Z_p}{R_p}\left(\frac{R_L+R_p}{R_L+Z_p}\right)=\left(\frac{R_p}{R_p}\right)\left(\frac{R_L+R_p}{R_L+R_p}\right)=(1)\ (1)=1 \quad (8)$$

Equation 8 shows that the gain is unity at resonance for any value of resistance $R_L$ presented by the field effect transistor 28 in its drain-source circuit.

At any frequency above or below resonance, the impedance $Z_p$ presented by the transistor 28 is less than the impedance at resonance, $Z_{po}$. For large values of $R_L$ relative to $Z_p$ and $R_p$, Equation 8 becomes $$K_V\cong\left(\frac{Z_p}{R_p}\right)\left(\frac{R_L}{R_L}\right)\cong\frac{Z_p}{R_p}\cong 1 \quad (9)$$

where $R_L$ is substantially greater than $Z_p$ and $R_p$.

For small values of $R_L$ relative to $Z_p$ and $R_p$, Equation 8 becomes $$K_V\cong\left(\frac{Z_p}{R_p}\right)\left(\frac{R_p}{Z_p}\right)\cong 1 \quad (10)$$

where $R_L$ is substantially smaller than $Z_p$ and $R_p$.

Equation 9 shows that the voltage gain is minimum when $R_L$ is maximum at any frequency above or below resonance. Equation 10 shows that the voltage gain is maximum and approaches unity over the frequency range when $R_L$ is minimum at any frequency above or below resonance.

The bandwidth is given as:

$$BW=\frac{1}{2\pi R_{(eff)}C} \quad (11)$$

where $$R_{(eff)}=Z_{po}||R_L=\frac{Z_{po}R_L}{Z_{po}+R_L}$$

From Equation 11 it can be seen that (1) minimum bandwidth is obtained when $Z_{po}$ and $R_L$ are large. Since $R_L$ can be adjusted to large values, the minimum bandwidth is limited by the maximum $Z_{po}$, and (2) the maximum bandwidth is obtained when $R_L$ is minimum, which is equal to the saturation resistance of the field effect transistor (typically 500 ohms).

Figure 2:
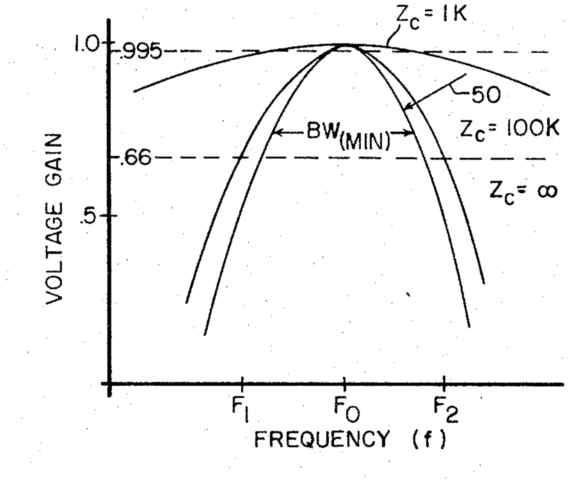
FIG. 2 is a graphical representation of the results obtained when practicing the present invention.
Figure 3:
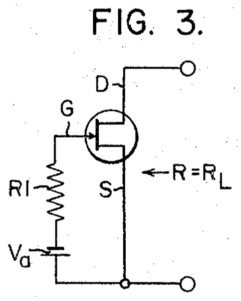
FIG. 3 is an electrical schematic diagram useful in understanding the operation of the present invention.

The variance in bandwidth and voltage gain is graphically illustrated in FIG. 2. From FIG. 2, it can be seen that by varying the resistance presented by the field effect transistor 28, the output or collector impedance $Z_c$ will control the bandwidth of the circuit. The arrow 50 indicates the direction of increasing resistance $R_3'$ as provided by the transistor 28 and its effect upon the output impedance $Z_c$. It can be seen that the bandwidth of the circuit varies with the output impedance $Z_c$ which in turn is controlled by the impedance of the field effect transistor 28.

At the same time, however, the voltage control $-V_c$ also varies the impedance of the field effect transistor 30, and to the same extent since they are matched transistors. Accordingly, from Equations 1 and 8 it can be seen that the common or emitter impedance $Z_e$ is varied to the same extent as the output impedance thereby maintaining the gain $K_v$ of the circuit at unity when at the resonant frequency $F_o$.

For example, a 5 to 1 bandwidth change is readily obtainable if the capacitor 6 equals 1000 micro-microfarads, the inductor 8 equals 25.2 microhenries and the resistor 10 equals 12.5 ohms in the tuned circuit 4.

The resonant frequency than is equal to $$\frac{1}{2\pi\sqrt{LC}}$$

which would be equal to 1 megacycle and the output impedance at resonance, $$Z_{po}=\frac{L}{RC}=2000 \text{ ohms}$$

Figure 4:
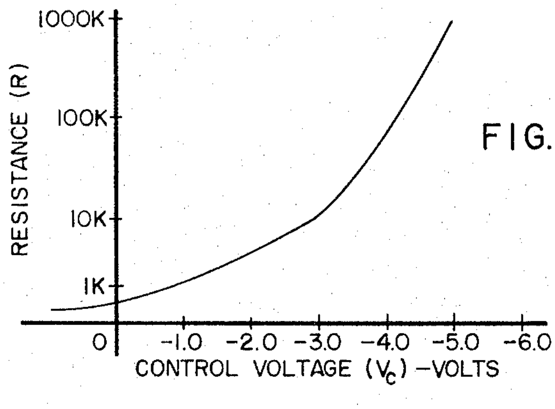
FIG. 4 is a characteristic operating curve of a component utilized in the illustrative embodiment shown in FIG. 1.

Considering the equivalent circuit of a field effect transistor having its gate connected to a gating resistor R1 and voltage source $V_a$, it can be seen that the impedance presented at the output terminals of the drain-source circuit will vary as shown in FIG. 4. If the control voltage varies from −3 volts to 0 volt, the impedance at the output terminals of the field effect transistor will vary from 10 kilohms to 500 ohms. Substituting into Equation 11, the bandwidth will change from 80 kilocycles to 400 kilocycles, or a bandwidth change of 5 to 1. It is readily apparent from the characteristic curve of a typical field effect transistor as shown in FIG. 4 that a much wider bandwidth dynamic range change is possible when desired.

Hence, the circuitry of the present invention provides an accurately controlled bandwidth over a wide dynamic range. By programming the control voltage $-V_c$, the bandwidth can be controlled at a very fast rate. Stages of the circuit shown in FIG. 1 can be cascaded for narrow band applications. Additional amplifying stages can be added where large voltage gains are required. Since field effect transistors are now available with frequency cut-offs up to at least 100 megacycles, many applications are possible. Any broadcast, communications, television or radar receivers, especially where miniaturization is desirable, will find application for the circuitry of the present invention. This is especially so in radar receivers where it may be desirable to change the pulse width with every pulse repetition frequency signal received.

While the present invention has been described with a degree of particularity for the purposes of illustration, it is to be understood that all modifications, alterations, and substitutions within the spirit and scope of the present invention are herein meant to be included. For example, although field effect transistors have been shown for the purposes of illustration, it is to be understood that any voltage controlled wide range variable impedance device may be utilized. At the same time the tuned circuit 4 was only chosen for the purpose of illustration and any suitable tuned circuit may be utilized in the bandwidth control circuitry.

We claim as our invention:

1. In a circuit for controlling the bandwidth of a variable frequency input signal passing therethrough and maintaining a constant center frequency gain, the combination comprising semiconductor translating means including at least a base electrode, a collector electrode and an emitter electrode; input means for connecting the variable frequency input signal to said base electrode; a tuned circuit resonant at the center frequency and a first field effect transistor means connected in a first parallel circuit combination across the collector electrode to ground; output means connected to said first combination; impedance means and a second field effect transistor means connected in a second parallel circuit combination connecting the emitter electrode to ground; and means for simultaneously varying the impedance of each field effect transistor means to maintain the impedance of the second parallel circuit combination substantially equal to the impedance of the first parallel circuit combination when at the resonant frequency of said tuned circuit as the first field effect transistor means varies the frequency bandwidth of input signal allowed to said output means.

2. In a circuit for controlling the bandwidth of a variable frequency input signal passing therethrough and maintaining a constant center frequency gain, the combination comprising semiconductor translating means including at least a base electrode, a collector electrode and an emitter electrode; input means for connecting the variable frequency input signal to said base electrode; a tuned circuit resonant at the center frequency and a first field effect transistor means connected in a first parallel circuit combination across the collector electrode to ground; output means connected to said first combination; impedance means and a second field effect transistor means connected in a second parallel circuit combination connecting the emitter electrode to ground; said impedance means having a magnitude of impedance substantially equal to the impedance of said tuned circuit when at resonance; and means for simultaneously varying the impedance of each field effect transistor means to maintain the impedance of the second parallel circuit combination substantially equal to the impedance of the first parallel circuit combination when at the resonant frequency of said tuned circuit as the first field effect transistor means varies the frequency bandwidth of input signal allowed to said output means.

3. A static circuit for controlling bandwidth while maintaining a constant gain at resonance comprising, in combination; a signal translating device having at least a base electrode, a collector electrode and an emitter electrode; input means for connecting a variable frequency input signal to said base electrode; output means including a tuned circuit resonant at said center frequency connected to said collector electrode; first field effect transistor means connected to said tuned circuit for varying the bandwidth of the signal appearing at the output means; impedance means connected to said emitter electrode and including an impedance element having an impedance of a magnitude substantially equal to the impedance of said tuned circuit when at resonance; second field effect transistor means connected to said emitter electrode for varying the impedance connected to said emitter electrode to be substantially equal to the magnitude of the impedance of said output impedance as the first field effect transistor means varies to control the bandwidth; and means for varying said first field effect transistor means and said second field effect transistor means simultaneously.

References Cited

UNITED STATES PATENTS 2,933,694 4/1960 Carter.

OTHER REFERENCES

"Variable Resistance FET Gives 75-db Gain Control," Electronic Design, vol. 11, No. 18, August 30, 1963, p. 56.

ROY LAKE, *Primary Examiner.*

J. B. MULLINS, *Assistant Examiner.*